United States Patent
Yonce et al.

(10) Patent No.: US 6,407,931 B1
(45) Date of Patent: Jun. 18, 2002

(54) DC TO DC CONVERTER

(75) Inventors: David J. Yonce, Fridley; Scott T. Mazar, Inver Grove Heights; Scott R. Vanderlinde, Plymouth, all of MN (US)

(73) Assignee: Cardiac Pacemakers, Inc., St. Pauls, MN (US)

( * ) Notice: Subject to any disclaimer, the term of this patent is extended or adjusted under 35 U.S.C. 154(b) by 0 days.

(21) Appl. No.: 09/614,467

(22) Filed: Jul. 11, 2000

(51) Int. Cl.[7] .............................. H05K 9/00; H05K 7/20
(52) U.S. Cl. ...................... 361/816; 361/707; 361/728; 363/141; 336/65
(58) Field of Search ................................. 361/752, 753, 361/801, 715, 707, 816, 728; 336/65, 92; 363/13, 141; 307/150

(56) References Cited

U.S. PATENT DOCUMENTS

| | | | | |
|---|---|---|---|---|
| 4,405,913 A | * | 9/1983 | Finkbeiner | 336/98 |
| 4,510,478 A | * | 4/1985 | Finkbeiner | 336/198 |
| 4,872,102 A | * | 10/1989 | Getter | 363/141 |
| 5,075,821 A | * | 12/1991 | McDonnal | 361/721 |
| 5,521,792 A | * | 5/1996 | Plertz et al. | 361/715 |
| 5,548,264 A | * | 8/1996 | Teshima et al. | 336/65 |
| 5,726,616 A | * | 3/1998 | Bell | 336/92 |
| 5,815,061 A | * | 9/1998 | Ho | 336/192 |
| 5,835,352 A | * | 11/1998 | Matsuzaki et al. | 361/707 |
| 5,996,214 A | * | 12/1999 | Bell | 29/605 |
| 6,008,712 A | * | 12/1999 | Tokuda et al. | 336/198 |
| 6,046,908 A | * | 4/2000 | Feng | 361/707 |

FOREIGN PATENT DOCUMENTS

| | | | |
|---|---|---|---|
| GB | 2 026 260 A | * | 1/1980 |
| WO | WO 00/72647 A1 | * | 11/2000 |

* cited by examiner

*Primary Examiner*—Jayprakash N. Gandhi
(74) *Attorney, Agent, or Firm*—Nikolai & Mersereau, P.A.

(57) ABSTRACT

A DC to DC converter having a flange attached to the housing. The flange configured to electrically isolate, insulate and shield the DC to DC converter from an underlying circuit board. The flange may be further configured to meet creepage distances and air clearances required by various regulatory and certification agencies.

11 Claims, 4 Drawing Sheets

DC TO DC CONVERTER

BACKGROUND OF THE INVENTION

1. Field of the Invention

The present invention relates generally to converters and more particularly to DC to DC converters providing increased creepage and air-clearance distances.

2. Description of the Related Art

Conventional DC to DC converters are used in commercial electronic devices to change a first DC voltage into a second DC voltage with minimal loss in power. A variety of electronic devices rely on DC to DC converters, including but not limited to electronically controlled medical devices, telecommunications devices, portable computers, and cameras. Typically, the DC to DC converters require particular clearances, spacing and shielding to meet the requirements of the particular applications. In applications such as ECG's, there is commonly a requirement that the patient connection be isolated from the remainder of the electronics. The shielding prevents electrical noise from interfering with the circuit's function. The clearances and spacing establish the appropriate creepage distances and air clearances as required for the particular application. These creepage distance and air clearance requirements are typically driven by the various industries' safety standards. In order to meet these requirements, circuit boards are typically configured with void spaces to permit a sufficient distance between the components. The void spaces reduce the circuit density for the particular application and increase the size of the electrical device. Therefore, a need exists for a DC to DC converter that maintains the appropriate clearances and spacing without reducing circuit density or increasing the size of the component.

The present invention meets the above needs and provides additional advantages and improvements that will be evident to those skilled in the art upon review of the following description and figures.

SUMMARY OF THE INVENTION

The present invention provides a DC to DC converter having improved isolation, insulation and shielding. The present invention includes a DC to DC converter as typically used in a variety of electronics applications and a housing which including a flange. The housing may be configured to provide shielding from electromagnetic interference. The housing may be wholly or in part composed of a metal to shield the circuit board from electrical noise. When composed of a metal, the metal is typically electrically connected to the non-isolated side. The flange may be configured to provide the necessary creepage and air clearances, as required by the particular industries. The flange may be composed of an insulating material. The flange is typically attached to a bottom side of the housing wherein the flange may be integral with the housing or a separate component attached to the housing. The flange may extend around a portion of the housing's periphery or extend around the housing's entire periphery. The housing may further include base plate which is typically attached to the bottom side of the housing. The base plate may be composed of an electrically insulating material. The base plate may cover a portion or all of the housing's bottom. The flange may be attached to the housing via the base plate. That is, the flange is integral with or attached to the base plate and the base plate is attached to the housing. In addition, the bottom side of the housing or the base plate may include at least one spacer to allow the proper spacing of the converter from the circuit board during manufacture.

DETAILED DESCRIPTION OF THE INVENTION

The present invention is described in the context of a medical device designed for recording ECG's. The disclosure is in no way intended to limit the scope of the present invention to medical devices. Those skilled in the art will recognize the present invention may be applied in a variety of applications and in a variety of power supply configurations in order to satisfy diverse creepage, clearance, isolation, insulating and shielding requirements in a variety of electronics industries.

For purposes of the following disclosure air clearance is defined as the shortest path in air between two conductive parts and creepage distance is defined as the shortest path along the surface of an insulating material between two conductive parts.

Figure 1:
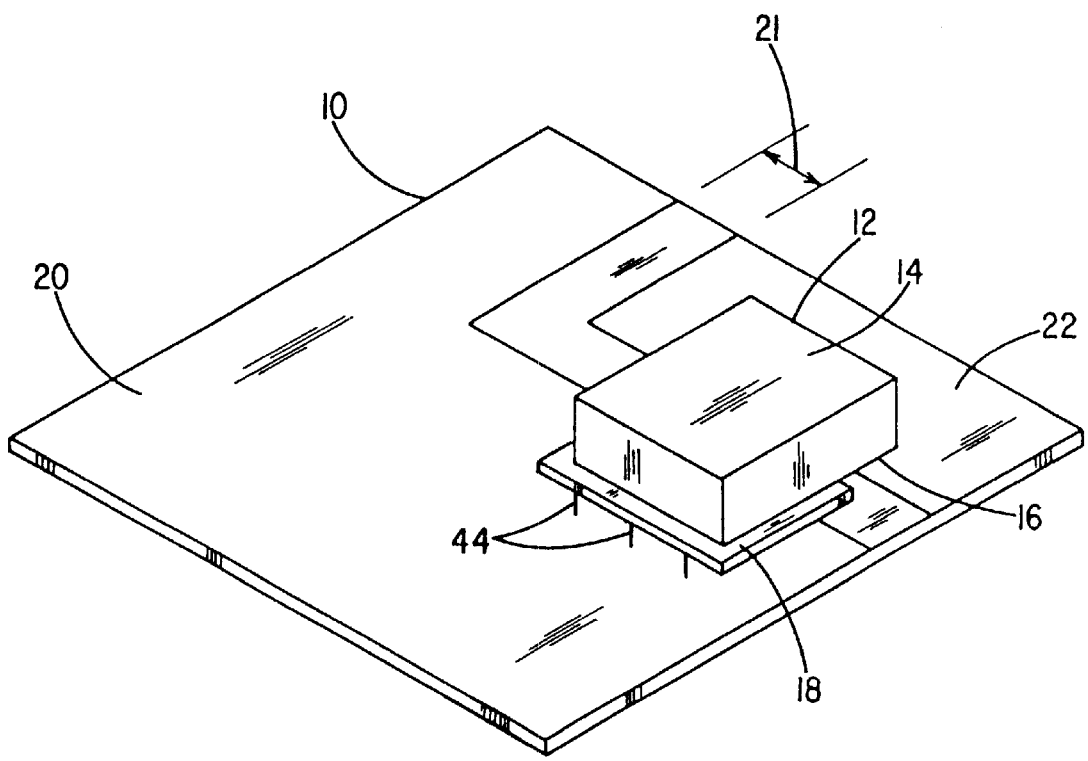
FIG. 1 illustrates a perspective view of a DC to DC converter in accordance with the present invention.

FIG. 1 shows a DC to DC converter 12 in accordance with the present invention mounted on a printed circuit board 10. Printed circuit board 10 typically includes an isolated electronics region 20 and a general electronics region 22 separated by an isolation space 21. Isolation space 21 is typically configured to satisfy air clearance and creepage distance requirements between general electronics region 22 and isolated electronics region 20.

DC to DC converter 12 includes a housing 14, and a flange 18. In addition, DC to DC converter 12 may include a base plate 16. Housing 14 is typically configured to house the electronic elements of DC to DC converter 12. Housing 14 is typically composed of a metal or a plastic. When composed of a metal, housing 14 may also shields other components from electrical noise by minimizing the electromagnetic radiation emitted from the converter. Base plate 16 is typically made of an electrically insulating material and may be integral with flange 18, housing 14, or both the flange and housing. Base plate 16 typically covers at least a portion the bottom of the converter's housing and in part electrically isolates the converter from underlying printed circuit board 10.

Figure 3:
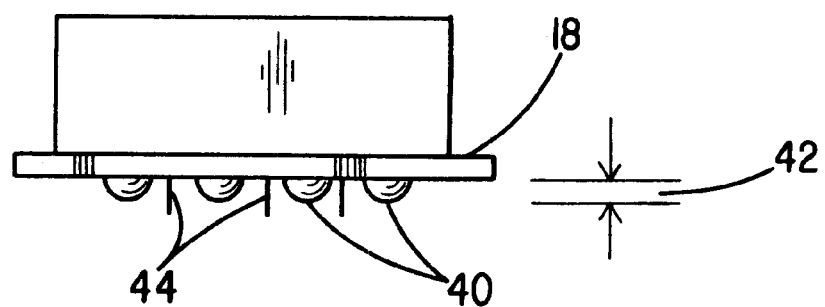
FIG. 3 illustrates a side view of a DC to DC converter including a spacer attached to the base.

Base plate 16 may further include at least one spacer 40, shown in FIG. 3, on the base plate's underside. Spacers 40 are directed toward the printed circuit board and are sized to properly space the converter from printed circuit board 10 during assembly. Spacers 40 hold the converter above the printed circuit board at a predetermined distance 42 after connector pins 44 are inserted into the printed circuit board during manufacture.

Figure 2:
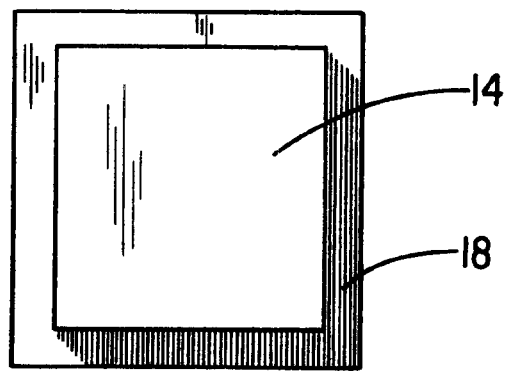
FIG. 2 illustrates a top view of a DC to DC converter including a circumferential flange.
Figure 4:
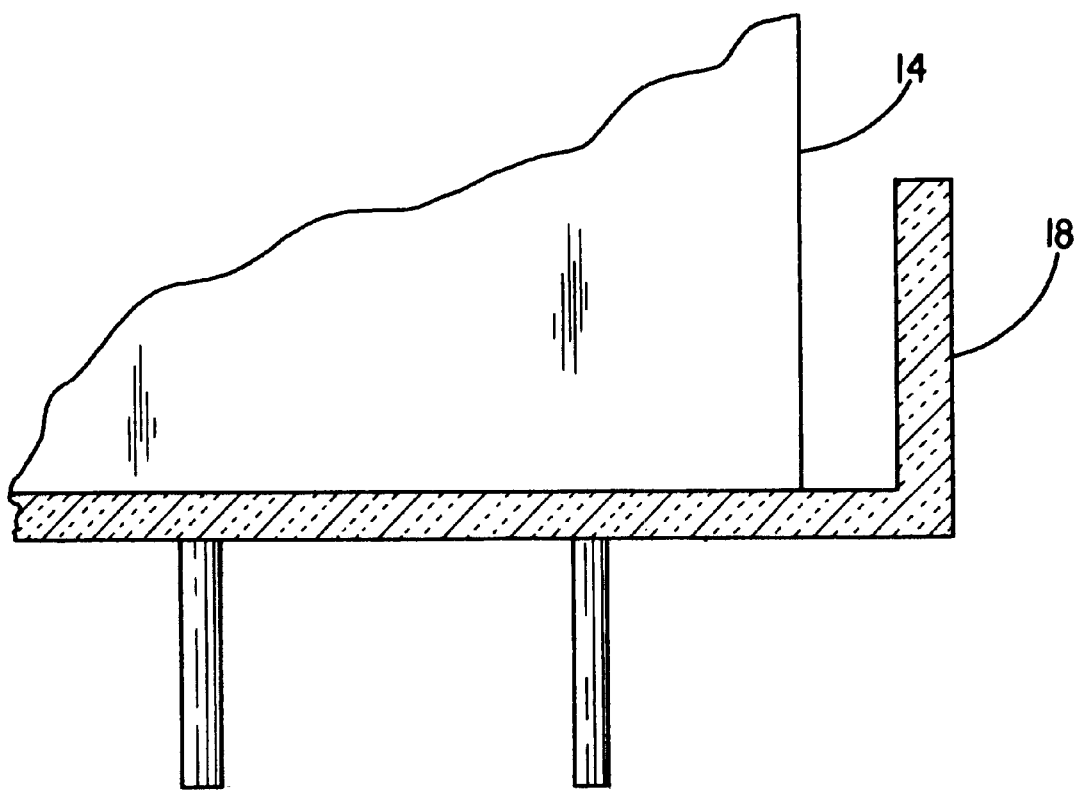
FIG. 4 illustrates a cross sectional partial side view of an alternative embodiment of the flange.

Flange 18 typically extends laterally beyond the housing in order to create a creepage distance and air clearance distance great enough to conform to the relevant safety requirements. In DC to DC converters having base plates, flange 18 may be integral with base plate 16. Flange 18 typically extends around the bottom of the housing. Flange 18 may extend circumferentially around housing 14, as shown in FIG. 2, or may extend around only a portion of the housing's circumference, as shown in FIG. 1. Flange 18 is typically positioned to be coplanar with the side of the housing to be placed adjacent to printed circuit board 10. Although, as shown in FIG. 4, the whole flange 18 or a portion of flange 18 may be angled upward relative to the circuit board. Base plate 16 and flange 18 may be integral with one another in that they may be formed as a single unit and attached to the bottom of the housing; they may be formed from different materials, attached to one another and then attached to the bottom of the housing; or they may be separately attached to the housing. Flange 18 is typically composed of an insulating material.

Figure 5A:
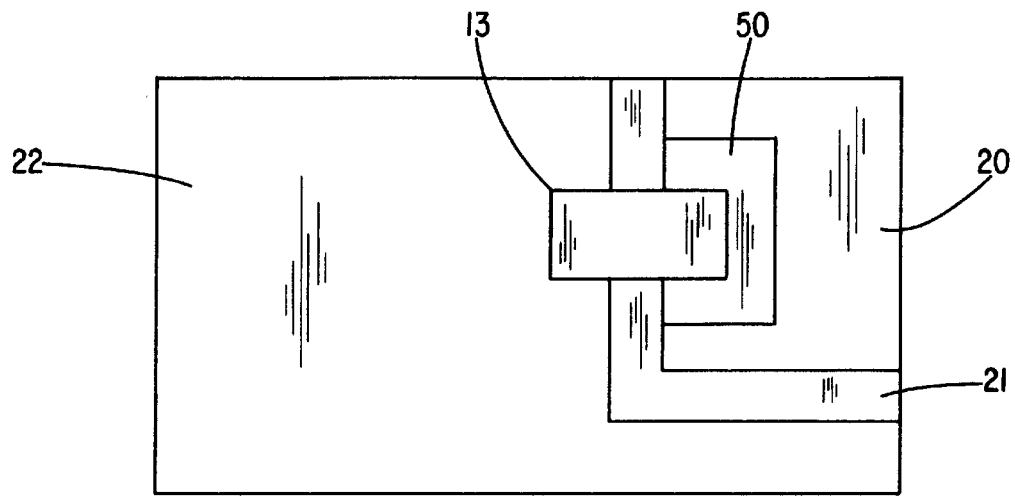
FIG. 5A illustrates the spacing required for appropriate creepage and clearance distances by prior art DC to DC converters.
Figure 5B:
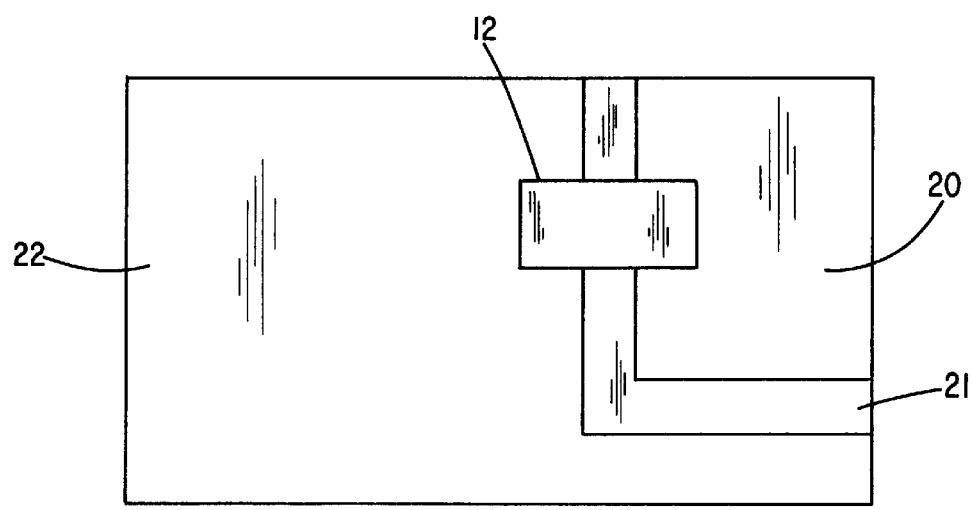
FIG. 5B illustrates the spacing required for appropriate creepage and clearance distances using a DC to DC converter in accordance with the present invention.

In use, a DC to DC converter of the present invention allows an increase in circuit density, as shown in FIGS. 5A and 5B. FIG. 5A shows a top view of a printed circuit board having a prior art DC to DC converter 13. In the prior art, isolation space 21 had to be extended in the area adjacent to DC to DC converter 13 to accommodate the required creepage and air clearance distances to isolated electronic region 20. Further, any traces from DC to DC converter 13 to isolated electronics region 20 typically have to be buried in circuit board 10 to meet the creepage and clearance distances. These requirements create a void region 50 on which no circuitry may be printed, thus reducing the circuit density for the circuit board. FIG. 5B shows a top view of a printed circuit board having a DC to DC converter 12 in accordance with the present invention. Flange 18, not shown, extends around the periphery of the housing at least on the side adjacent to isolated electronics region 20. Flange 18 is typically configured to extend the creepage and air clearance distances so that they meet the requirements for the particular industry of application. Flange 18 thus allows the elimination of void region 50. This provides additional space for the printing of circuits and increases circuit density.

What is claimed is:

1. A DC to DC converter, comprising:

a. a conductive housing member containing said DC to DC converter, said housing member inhibiting release of electromagnetic interference and being mounted with respect to a printed circuit board having conductive traces thereon and partitioned by an insulating isolation space into an isolated electronics region and a general electronics region;

b. an insulating flange on the housing member and projecting outwardly therefrom around a predetermined portion of the periphery of the housing member proximate said isolated electronics region; and c. the insulating flange being dimensioned to provide an acceptable creepage distance and air clearance distance between the conductive housing member of the DC to DC converter and the isolated electronics region.

2. The DC to DC converter, as in claim 1, wherein the flange is attached to a bottom side of the housing and is coplanar with the bottom side of the housing.

3. The DC to DC converter, as in claim 2, wherein the flange is integral with the housing.

4. The DC to DC converter, as in claim 1, further comprising at least one spacer secured to a bottom side of the DC to DC converter housing member to increase the air clearance between the circuit board and the housing.

5. The DC to DC converter, as in claim 1, further comprising a base plate.

6. The DC to DC converter, as in claim 5, wherein the flange is attached to the base plate.

7. The DC to DC converter, as in claim 5, wherein the flange is integral with the base plate.

8. The DC to DC converter, as in claim 5, wherein the base plate covers at least a portion of the bottom of the housing member.

9. The DC to DC converter, as in claim 5, wherein the base plate is coextensive with the bottom of the housing member.

10. The DC to DC converter, as in claim 5, wherein the base plate is composed of an electrically insulating material.

11. The DC to DC converter, as in claim 5, further comprising at least one spacer secured to a bottom side of the base plate.

* * * * *